US009277138B1

(12) United States Patent
Bushmaker et al.

(10) Patent No.: US 9,277,138 B1
(45) Date of Patent: Mar. 1, 2016

(54) IMAGE DETECTION ASSEMBLY AND METHOD FOR USE IN DETERMINING TRANSIENT EFFECTS

(71) Applicant: The Aerospace Corporation, El Segundo, CA (US)

(72) Inventors: Adam Wayne Bushmaker, Los Angeles, CA (US); Terence S. Yeoh, El Segundo, CA (US); George C. Valley, El Segundo, CA (US)

(73) Assignee: The Aerospace Corporation, El Segundo, CA (US)

( * ) Notice: Subject to any disclaimer, the term of this patent is extended or adjusted under 35 U.S.C. 154(b) by 0 days.

(21) Appl. No.: 14/542,056

(22) Filed: Nov. 14, 2014

(51) Int. Cl.
*H04N 5/63* (2006.01)
*H04N 5/262* (2006.01)

(52) U.S. Cl.
CPC ..................... *H04N 5/262* (2013.01)

(58) Field of Classification Search
CPC ........................................................ H04N 5/31
USPC ....................................................... 348/571
See application file for complete search history.

(56) References Cited

U.S. PATENT DOCUMENTS

| 2004/0213463 | A1* | 10/2004 | Morrison | ................ | G01B 11/25 382/210 |
| 2010/0099049 | A1* | 4/2010 | Owa | .................... | G03F 7/70291 430/322 |
| 2012/0138586 | A1* | 6/2012 | Webster | ................. | A61B 18/20 219/121.64 |
| 2015/0280821 | A1* | 10/2015 | Breuer | ..................... | G01C 3/32 398/25 |
| 2015/0281905 | A1* | 10/2015 | Breuer | .................. | H04W 4/026 398/118 |
| 2015/0286340 | A1* | 10/2015 | Send | ....................... | G01S 17/46 345/175 |

OTHER PUBLICATIONS

Baraniuk, "Compressive Sensing [Lecture Notes]," *IEEE Signal Processing Magazine*, Jul. 2007, 24(4):118-120, 124.
Candès et al., "People Hearing Without Listening: An Introduction to Compressive Sampling," *Applied and Computational Mathematics, California Institute of Technology*, Date Unknown, Pasadena, California, 19 pages.
Falk, "Advanced LIVA/TIVA Techniques," *OptoMetrix, Inc.*, Date Unknown, Renton, Washington, 7 pages.
Loris, "L1Packv2: A Mathematica package for minimizing an $\ell_1$-penalized functional," *Computer Physics Communications*, 2008, 179:895-902.

(Continued)

*Primary Examiner* — Paulos M Natnael
(74) *Attorney, Agent, or Firm* — Manita Rawat; Duane Morris LLP (57) ABSTRACT

An image detection assembly includes a light source that is configured to generate at least one pulsed light beam. A modulator is configured to direct the pulsed light beam onto a device via a plurality of light patterns such that a plurality of electrical signals are generated by the device. Each electrical signal corresponds to a different light pattern. A signal processing apparatus is coupled to the device and the signal processing apparatus is configured to receive the electrical signals and to digitize each electrical signal to record a plurality of signal vectors such that each signal vector corresponds to a different electrical signal. The signal processing apparatus is also configured to generate at least one image output based, at least in part, on the recorded signal vectors and the light patterns such that the image output enables a determination of at least one transient effect on the device.

22 Claims, 4 Drawing Sheets

(56) References Cited

OTHER PUBLICATIONS

Phang et al., "A Review of Laser Induced Techniques for Microelectronic Failure Analysis," *IEEE Proceedings of 11$^{th}$ APFA*, 2004, Taiwan, pp. 255-261.

Sun, "Compressive Sensing and Imaging Applications," *Rice University Doctoral Thesis*, Houston, Texas, Dec. 2011, 140 pages.

Valley et al., "Chapter 9: Applications of the Orthogonal Matching Pursuit/Nonlinear Least Squares Algorith to Compressive Sensing Recovery," from *Applications of Digital Signal Processing*, Cuadrado-Laborde, ed., Nov. 2011, InTech Publishing, Rijeka, Croatia, pp. 169-190.

* cited by examiner

IMAGE DETECTION ASSEMBLY AND METHOD FOR USE IN DETERMINING TRANSIENT EFFECTS

BACKGROUND

The embodiments described herein relate generally to image data collection and analysis systems, and, more particularly, to an image detection assembly that can be used with such systems for the determination of transient effects on components or devices, such as integrated circuits ("IC").

It is advantageous to collect and analyze image data in an automated fashion when comparing the image of a product to an ideal product image, or for detecting changes in a product from transient events or effects. The product in question could be an IC, for example, and comparison of the conductors and vias visible on the surface of the IC to those of an ideal image may reveal contaminants, manufacturing defects, physical damage, such as radiation damage, or even the presence of spurious circuitry (e.g., a hardware version of malware hidden therein). Other products may also be advantageously imaged for purposes of discriminating for changes, comparing an image to an expected image, and generally analyzing the visible features of a product by collecting and processing an image.

Various image and other surface detection and characterization techniques can be used to identify features, such as defects. Some optoelectronic data collection and image characterization techniques are known for collecting and assessing data representing the appearance, spatial characteristics, and changes in the appearance or characteristics of ICs. However, an image characterization that is sufficiently detailed to enable identification of a single event upset ("SEU"), such as a point of isolated radiation damage, that might have occurred at any location on the area of the IC, requires collection of data at all points of the IC where the damage might have occurred. One might collect a high resolution pixel image under illumination, for example by scanning a laser over each part of the IC in a raster, and collecting and digitizing the reflected amplitude at each pixel position. However, such a technique can be time consuming and produce a great deal of pixel data. Therefore, such known techniques can be inefficient, can consume time and resources, and are subject to systematic errors.

BRIEF DESCRIPTION

In one embodiment, an image detection assembly is provided that uses compressive sensing to enable the determination of transient effects on components or devices, such as ICs, wherein the determination can be made efficiently and with relatively little to no systematic errors. The image detection assembly generally includes a light source that is configured to generate at least one pulsed light beam. A modulator is positioned along a beam path from the light source, wherein the modulator is configured to direct the pulsed light beam onto a device via a plurality of light patterns such that a plurality of electrical signals are generated by the device. Each electrical signal corresponds to a different light pattern. A signal processing apparatus is coupled to the device and the signal processing apparatus is configured to receive the electrical signals and to digitize each electrical signal to record a plurality of signal vectors such that each signal vector corresponds to a different electrical signal. The signal processing apparatus is also configured to generate at least one image output based, at least in part, on the recorded signal vectors and the light patterns such that the image output enables a determination of at least one transient effect on the device.

In another embodiment, a method for determining transient effects on a device is provided. The method includes generating at least one pulsed light beam via a light source. The pulsed light beam is directed, using a modulator, onto a device via a plurality of light patterns such that a plurality of electrical signals are generated. Each electrical signal corresponds to a different light pattern. The electrical signals are received via a signal processing apparatus that is coupled to the device. Each electrical signal is digitized, via the signal processing apparatus, to record a plurality of signal vectors such that each signal vector corresponds to a different electrical signal. At least one image output is generated, based, at least in part, on the recorded signal vectors and the light patterns. The presence of at least one transient effect on the device is determined by using the image output.

In yet another embodiment, a system is provided that includes a device and an image detection assembly that is coupled to the device. The image detection assembly includes a light source that is configured to generate at least one pulsed light beam. A modulator is positioned along a beam path from the light source, wherein the modulator is configured to direct the pulsed light beam onto the device via a plurality of light patterns such that a plurality of electrical signals are generated by the device. Each electrical signal corresponds to a different light pattern. A signal processing apparatus is coupled to the device and the signal processing apparatus is configured to receive the electrical signals and to digitize each electrical signal to record a plurality of signal vectors such that each signal vector corresponds to a different electrical signal. The signal processing apparatus is also configured to generate at least one image output based, at least in part, on the recorded signal vectors and the light patterns such that the image output enables a determination of at least one transient effect on the device.

DETAILED DESCRIPTION

The embodiments described herein include an image detection assembly that enables the determination of transient effects on components or devices, such as ICs, wherein the determination can be made efficiently and with relatively little to no systematic errors. The image detection assembly uses compressive sensing to facilitate extracting a spatial and/or temporal response from every point in the device with relatively fewer measurements. In some embodiments, a pulsed or modulated light source enables light or a light beam to be directed onto the device via a random pattern that is suitable for compressive sensing, and the electrical response of the device is measured. A compressive sensing recovery algorithm is then used with the time series of the determined values of the measurements for the electrical response to generate at least one image output of the transient signals on the device. The image output enables a determination of at least one transient effect on the device.

Figure 1:
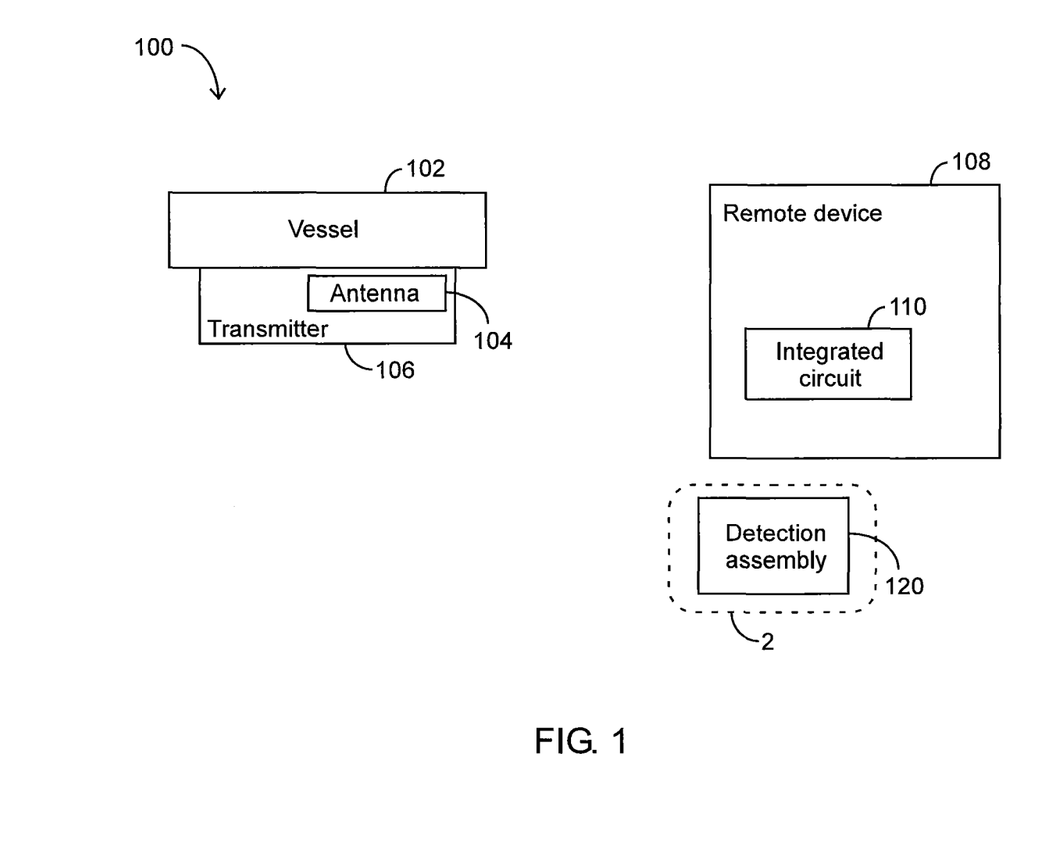
FIG. 1 is a block diagram of an exemplary system.

FIG. 1 illustrates an exemplary system that includes a system 100, such as a satellite communication system. While the exemplary embodiment illustrates a satellite communication system, the present disclosure is not limited to such systems and one of ordinary skill in the art will appreciate that the present disclosure can be used with various types of systems. System 100 includes a vessel 102, such as a spacecraft. An antenna 104 and a transmitter 106 are coupled to vessel 102 and configured to transmit signals from vessel 102 to, for example, a remote device 108, such as a computing device, such that communication can occur between vessel 102 and device 108. While the exemplary embodiment illustrates a computing device, the present disclosure is not limited to computing devices and one of ordinary skill in the art will appreciate that the present disclosure can be used with various types of devices.

Various connections may be available between device 108 and vessel 102, including but not limited to a low-level serial data connection, such as Recommended Standard (RS) 232 or RS-485, a high-level serial data connection, such as Universal Serial Bus (USB) or Institute of Electrical and Electronics Engineers (IEEE®) 1394, a parallel data connection, such as IEEE® 1284 or IEEE® 488, a short-range wireless communication channel such as BLUETOOTH®, and/or a private (e.g., inaccessible system) network connection, whether wired or wireless. IEEE is a registered trademark of the Institute of Electrical and Electronics Engineers, Inc., of New York, N.Y. BLUETOOTH is a registered trademark of Bluetooth SIG, Inc. of Kirkland, Wash. It should be noted that, as used herein, the term "couple" is not limited to a direct mechanical and/or an electrical connection between components, but may also include an indirect mechanical and/or electrical connection between two or more components or a coupling that is operative through intermediate elements or spaces.

Device 108 comprises an IC 110. In some embodiments, IC 110 can be a three-dimensional ("3D") semiconductor IC that includes a plurality of layers (not shown) that can be vertically stacked on top of one another. In some embodiments, the layers can be individual dies or chips, such as two-dimensional ("2D") chips, that are electrically coupled to one another with at least one through-substrate via ("TSV") and microbumps. In other embodiments, the layers can be stacked tiers, that are electrically coupled to one another with at least one inter-layer via ("ILV") (not shown) or inter-device via ("IDV") (not shown). In some embodiments, each layer of IC 110 can be a respective "tier" where each tier can include a respective active device layer and a respective interconnect structure, which can include a plurality of conductive layers (not shown).

A image detection assembly 120 is positioned proximate to IC 110. As explained in more detail below with respect to FIGS. 2 and 3, image detection assembly 120 is configured to determine transient effects on IC 110 by using compressive sensing such that the determination can be made efficiently and with relatively little to no systematic errors.

Figure 2:
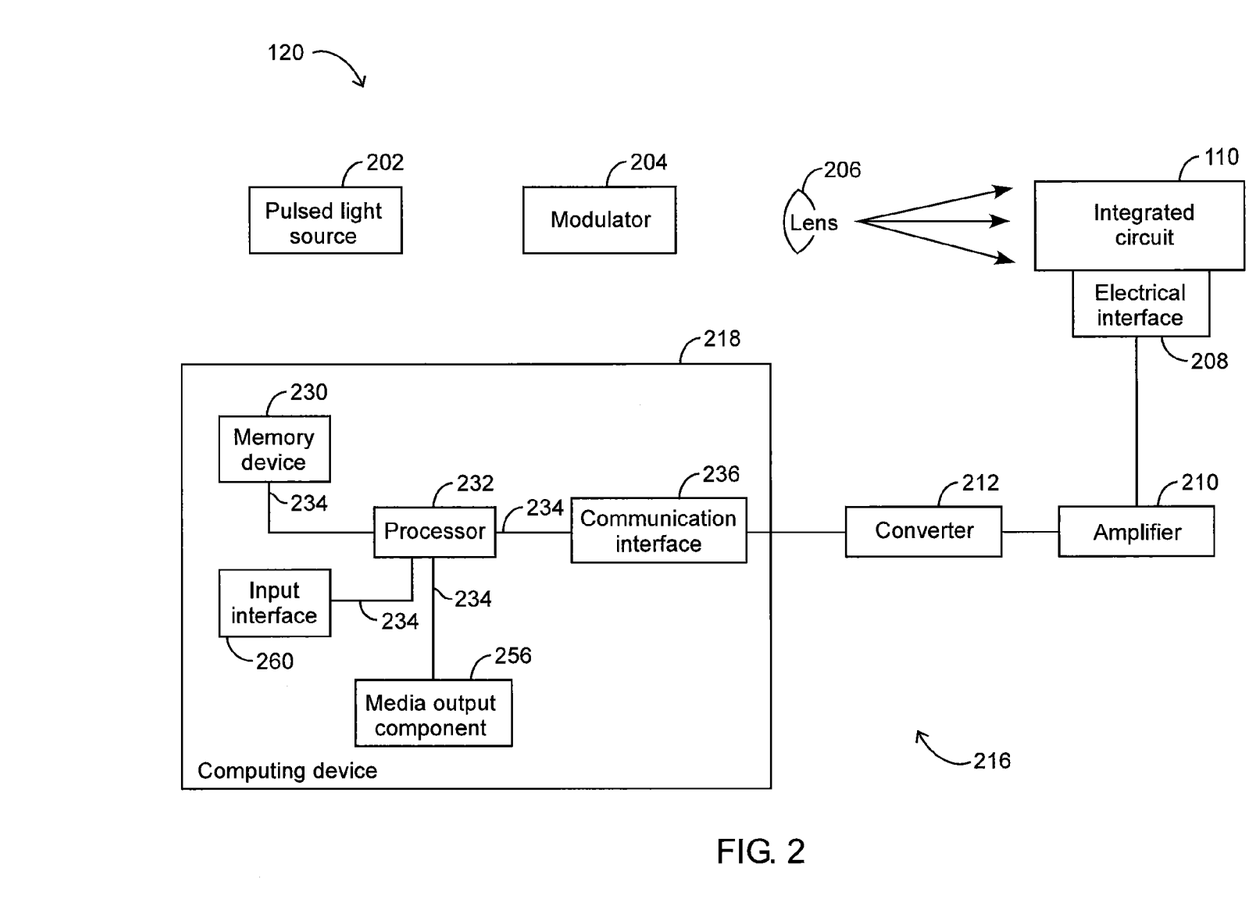
FIG. 2 is a block diagram of an exemplary image detection assembly that may be used with the system shown in FIG. 1 and taken from area 2.

FIG. 2 illustrates image detection assembly 120 taken from area 2 (shown in FIG. 1). Image detection assembly 120 includes a pulsed light source 202. In some embodiments, pulsed light source 202 can be a modulated or pulsed laser, such as a femtosecond (fs) ultrashort pulsed laser. Alternatively, pulsed light source 202 can be any suitable type of pulsed light source, such as a flash lamp, that enables image detection assembly 120 and/or system 100 (shown in FIG. 1) to function as described herein. Pulsed light source 202 is positioned proximate to IC 110 and configured to generate at least one pulsed light beam that can be directed onto IC 110.

In some embodiments, a modulator 204 is positioned proximate to pulsed light source 202. Modulator 204 can be a spatial light modulator, such as the types of modulators found in liquid-crystal display ("LCD") projection systems. Modulator 204 is configured to project the pulsed light beam onto IC 110 via a plurality of patterns. The patterns can include any suitable pattern, such as a random pattern, a pseudo-random pattern, or a deterministic pattern in which the rows are nearly uncorrelated with each other, that is used with known compressive sensing techniques. Positioned proximate to modulator 204 is a lens 206 that is configured to facilitate directing the light beam via the patterns onto IC 110.

An electrical interface 208, such as a connector, is coupled to a power supply (not shown) or to an output voltage (not shown) of IC 110 such that electrical interface 208 can receive electrical signal(s) from IC 110. In some embodiments, an amplifier 210 is coupled to electrical interface 208. Amplifier 210 is configured to alter or modify, such as amplify, the electrical signal(s) that electrical interface 208 receives from IC 110. Depending on the strength of the electrical signals being received from IC 110, image detection assembly 120 may or may not include amplifier 210. For example, if the strength of the electrical signals are sufficient for performing a compressive sensing analysis, amplifier 210 may not be needed. Coupled to amplifier 210, is a signal processing apparatus 216 that is configured to receive the electrical signals from IC 110. Signal processing apparatus 216 includes a converter 212 that is configured to perform signal digitization of the signals received from IC 110. Converter 212 may be any suitable converter that enables image detection assembly 120 and/or system 100 to function as described herein. For example, in some embodiments, converter 212 can be an analog-to-digital converter ("ADC").

Signal processing apparatus also includes a computing device 218 that is coupled to converter 212. Computing device 218, in some embodiments, may include any suitable processor-based or microprocessor-based system, such as a computer system, that includes reduced instruction set circuits (RISC), application-specific integrated circuits (ASICs), logic circuits, and/or any other circuit or processor that is capable of executing the functions described herein. In one embodiment, computing device 218 can be a microprocessor that includes read-only memory (ROM) and/or random access memory (RAM), such as, for example, a 32 bit microcomputer with 2 Mbit ROM and 64 Kbit RAM.

In some embodiments, computing device 218 includes a memory device 230 that stores executable instructions and/or one or more operating parameters. Computing device 218 also includes a processor 232 that is coupled to the memory device 230 via a system bus 234. In one embodiment, processor 232 can include a processing unit, such as, without limitation, an IC, an ASIC, a microcomputer, a programmable logic controller (PLC), and/or any other programmable circuit. Alternatively, processor 232 can include multiple processing units (e.g., in a multi-core configuration). The above examples are exemplary only, and thus are not intended to limit in any way the definition and/or meaning of the term "processor."

Moreover, in the exemplary embodiment, computing device 218 includes a communication interface 236 that is coupled to converter 212 and that is configured to receive signals from converter 212. Various connections are available between converter 212 and communication interface 236. Such connections may include, without limitation, an electrical conductor, a low-level serial data connection, such as RS 232 or RS-485, a high-level serial data connection, such as USB, a field bus, a PROFIBUS®, or IEEE 1394 (a/k/a FIREWIRE), a parallel data connection, such as IEEE 1284 or IEEE 488, a short-range wireless communication channel such as BLUETOOTH, and/or a private (e.g., inaccessible outside system 100) network connection, whether wired or wireless.

Computing device 218 also includes at least one media output component 256 for use in presenting information to a user. Media output component 256 can be any component capable of conveying information to the user. Media output component 256 can include, without limitation, a display device (not shown) (e.g., an LCD, an organic light emitting diode (OLED) display, or an audio output device (e.g., a speaker or headphones)). Moreover, in some embodiments, computing device 218 includes an input interface 260 for receiving input from a user. Input interface 260 can include, for example, a keyboard, a pointing device, a mouse, a stylus, a touch sensitive panel (e.g., a touch pad or a touch screen), a gyroscope, an accelerometer, a position detector, and/or an audio input device. A single component, such as a touch screen, can function as both an output device of media output component 256 and input interface 260. In some embodiments, display capabilities are not needed. For example, the information can be saved to a disk, and then can be used for applications that don't require a display, such as automated testing. In an automated testing setup in a factory, for example, a computer might analyze the images without displaying them, and make decisions about pass/fail for a part lot. In some embodiments, the images can be saved to a disk, and then the user can take them to a different computing device for display.

During operation, as explained in more detail below with respect to FIG. 3, image detection assembly 120 facilitates the determination of transient effects on IC 110 by using compressive sensing. Pulsed light source 202 generates at least one pulsed light beam and modulator 204, along with lens 206, directs the light beam onto IC 110 via a plurality of light patterns. In response to the light patterns, IC 110 generates a plurality of electrical signals that are received by electrical interface 208 and transmitted to amplifier 210, wherein the signals are amplified. The amplified signals are transmitted to converter 212, wherein the signals are digitized and vectors that correspond to the signals are recorded. Signals representative of the recorded vectors are then transmitted from converter 212 to computing device 218. As explained in more detail below, computing device uses known compressive sensing algorithms to generate at least one image output (now shown in FIG. 2) that is based on the signals that are received. The image output enables a determination of at least one transient effect on IC 110. In some embodiments, at least two image outputs or a plurality of image outputs may be generated to enable a determination of at least one transient effect on IC 110.

Figure 3:
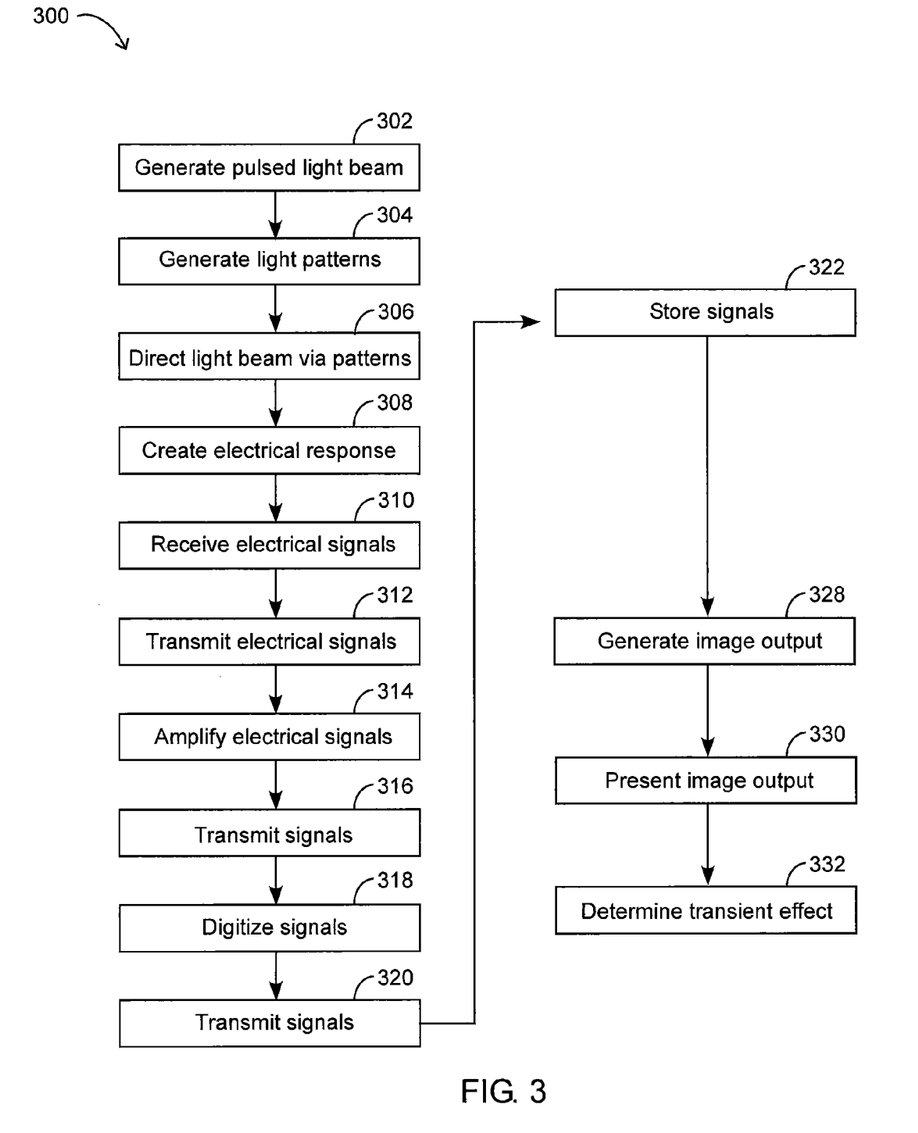
FIG. 3 is a flow diagram of an exemplary method for determining one or more transient effects using the image detection assembly shown in FIG. 2.

FIG. 3 is a flow diagram 300 of an exemplary method for determining one or more transient effects on IC 110 (shown in FIGS. 1 and 2) using image detection assembly 120 (shown in FIGS. 1 and 2). In step 302, at least one pulsed light beam is generated by pulsed light source 202 (shown in FIG. 2). In step 304, modulator 204 (shown in FIG. 2) generates a plurality of light patterns for the pulsed light beam. The light patterns can be any suitable pattern that is used for compressive sensing, such as a random pattern. In step 306, the light beam is directed, via the generated patterns, onto IC 110 by modulator 204 with lens 206 (shown in FIG. 2). For example, in some embodiments, multiple independent light patterns are flashed on IC 110 that are suitable for known compressive sensing mixing matrices.

In step 308, an electrical response to the light patterns is created by IC 110. In some embodiments, electrical signals are generated by IC 110, wherein each electrical signal corresponds to each light pattern that is directed onto IC 110. In some embodiments, each acquisition is started on a trigger signal that is received from pulsed light source 202.

The created electrical signals are received by electrical interface 208 (shown in FIG. 2) in step 310. In step 312, the electrical signals are transmitted to amplifier 210 (shown in FIG. 2). The signals are amplified by amplifier 210 in step 314. For example, in some embodiments, amplifier increases the power of the signals by a gain factor that is linearly applied across all frequencies in a pass band. In step 316, the amplified signals are transmitted to converter 212 (shown in FIG. 2) and, in step 318, converter 212 digitizes the signals such that the vectors corresponding to each of the signals can be recorded. Each vector corresponds to a different signal and can be a series of measurements or values. In some embodiments, the transient electrical signal from each exposure is read into a memory bank.

In step 320 signals representative of each of the recorded vectors are transmitted from converter 212 to computing device 218 (shown in FIG. 2) and, in step 322, the recorded vectors are stored in memory device 230 (shown in FIG. 2). In step 328, computing device 218, via processor 232 (shown in FIG. 2), generates at least one image output that is based, at least in part, on the recorded vectors and the corresponding patterns. For example, in some embodiments, computing device 218 generates the image output by executing a known compressive sensing recovery algorithm that uses the time series of the signal vectors and the pattern values. The known compressive sensing recovery algorithm used can be "basis pursuit denoising" (=penalized ell-1 norm) or "orthogonal matching pursuit." In some embodiments, the quality of the image output or recovered image depends on the signal-to-noise ratio, the sparsity of the image for IC 110, and the number of patterns, such as random patterns, that are used.

In some embodiments, the following exemplary computations can be used. Consider the signal vector x, of length n, which is going to measured. In some embodiments, x has a small number S non-zero elements in it (i.e., x is sparse). Make m measurements y of x by applying a mixing matrix A which gives a weighted sum of the elements in x, as seen in Equation 1 below.

$$y = Ax \qquad \text{Equation 1}$$

Then, x can be reconstructed from y by minimizing the result of the sum provided in Equation 2 below.

$$\Sigma 1 |x\_i| \qquad \text{Equation 2}$$

Equation 2 enforces sparsity in the solution by favoring x_i=0.

This favoring is under the condition, as set forth in Equation 3 below.

$$\sqrt{(\Sigma 1 (Ax\_i - y)^2)} \le \epsilon \qquad \text{Equation 3}$$

In Equation 3, $\epsilon$ can be some small number intended to limit error. Computational algorithms also exist which can find a solution for x, provided there is an initial guess for x to start with and the number of measurements m is large enough pursuant to Equation 4 below.

$$m \ge cS \cdot lo(n/S) \qquad \text{Equation 4}$$

In Equation 4, c ~2 is a small constant.

In some embodiments, computing device 218 generates at least one image output or a plurality of image outputs based, at least in part, on a plurality of time steps of the recorded values and the light patterns such that each image output corresponds to a different time step. For example, a first image output is generated for time t=0 and a second image output is generated for t=1 second and another image output is generated for t=n.

Figure 4:
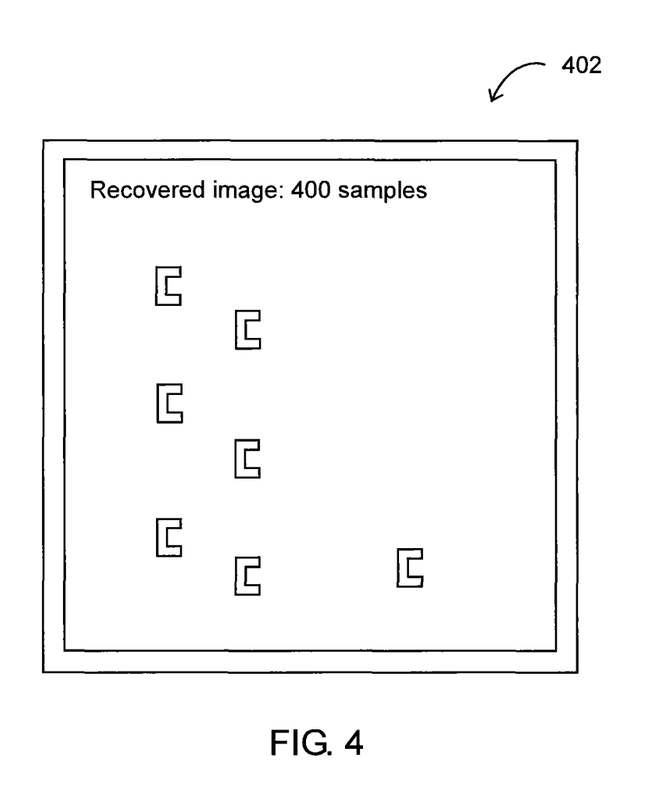
FIG. 4 is a representation of an exemplary output that is generated by the image detection assembly shown in FIG. 2.

In step 330, computing device 218 presents the image output(s) to a user such that the user can view the output(s). In step 332, at least one transient effect on IC 110 can be determined by, for example, viewing the image output(s). The transient effect can include spatial or a temporal responses of IC 110. For example, FIG. 4 includes an exemplary image output 402 that can be generated for a particular time step and can be presented by computing device 218. Image output 402 is recovered from 400 measurements of the image obtained by multiplying it by 400 different 64×64 matrices consisting of pseudo-randomly placed 0's and 1's. Image output 402 can be recovered using a known penalized ell-1 norm code. In this example, compressive sensing facilitates a reduction by a factor of 10 in sample count compared to other techniques, such as raster scanning A user can then determine the transient effects on IC 110 by, for example, viewing image output 402 and the other image outputs that are generated for the other time steps. Identifying the different changes on the image outputs can enable a determination as to the transient effects on IC 110.

As compared to known systems that are used for determining transient effects on components or devices, such as ICs, the embodiments described herein include an image detection assembly that enables an efficient determination of transient effects on components or devices such that systematic errors can be avoided. The image detection assembly uses compressive sensing to facilitate extracting a spatial and/or temporal response from every point in the device with relatively fewer measurements. In some embodiments, a pulsed or modulated light source enables light or a light beam to be directed onto the device via a random pattern that is suitable for compressive sensing, and the electrical response of the device is measured. A compressive sensing recovery algorithm is then used with the time series of the determined values of the measurements for the electrical response to generate an image output of the transient signals on the device. The image output enables a determination of at least one transient effect on the device.

Exemplary embodiments of the assemblies, systems, and methods are described above in detail. The assemblies, systems, and methods are not limited to the specific embodiments described herein, but rather, components of the assemblies, systems, and/or steps of the method may be utilized independently and separately from other components and/or steps described herein. For example, the assembly may also be used in combination with other systems and methods, and is not limited to practice with only a system as described herein. Rather, the exemplary embodiment can be implemented and utilized in connection with many other systems.

Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. An image detection assembly comprising:
   a light source configured to generate at least one pulsed light beam;
   a modulator that is positioned along a beam path from said light source, wherein said modulator is configured to direct the at least one pulsed light beam onto a device via a plurality of light patterns such that a plurality of electrical signals are generated by the device, wherein each of the plurality of electrical signals corresponds to a different light pattern of the plurality of light patterns; and
   a signal processing apparatus coupled to the device, wherein said signal processing apparatus is configured to:
     receive the plurality of electrical signals;
     digitize each of the plurality of electrical signals to record a plurality of signal vectors such that each of the plurality of signal vectors corresponds to a different electrical signal of the plurality of electrical signals; and
     generate at least one image output based, at least in part, on the plurality of recorded of signal vectors and the plurality of light patterns such that the at least one image output enables a determination of at least one transient effect on the device.

2. An image detection assembly in accordance with claim 1, further comprising an electrical interface coupled to the device, wherein said electrical interface is configured to receive the plurality of electrical signals prior to the plurality of electrical signals being received by said signal processing apparatus.

3. An image detection assembly in accordance with claim 1, further comprising an amplifier coupled to the device, wherein said amplifier is configured to modify the plurality of electrical signals prior to the plurality of electrical signals being received by said signal processing apparatus.

4. An image detection assembly in accordance with claim 1, wherein said signal processing apparatus comprises a converter coupled to the device, wherein said converter is configured to digitize each of the plurality of electrical signals.

5. An image detection assembly in accordance with claim 1, wherein said signal processing apparatus is configured to generate a plurality of image outputs based, at least in part, on a plurality of time steps of the plurality of recorded signal vectors and the plurality of light patterns such that each of the plurality of image outputs corresponds to a different time step of the plurality of time steps.

6. An image detection assembly in accordance with claim 1, wherein said signal processing apparatus is configured to generate the at least one image output by executing a compressive sensing recovery algorithm.

7. An image detection assembly in accordance with claim 1, wherein said signal processing apparatus is configured to generate the at least one image output such that the at least one image output enables a determination of at least one of a spatial or a temporal response of the device.

8. A method for determining transient effects on a device, wherein said method comprises:
- generating at least one pulsed light beam via a light source;
- directing the at least one pulsed light beam, using a modulator, onto a device via a plurality of light patterns such that a plurality of electrical signals are generated, wherein each of the plurality of electrical signals corresponds to a different light pattern of the plurality of light patterns;
- receiving the plurality of electrical signals via a signal, processing apparatus that is coupled to the device;
- digitizing each of the plurality of electrical signals, via the signal processing apparatus, to record a plurality of signal vectors such that each of the plurality of signal vectors corresponds to a different electrical signal of the plurality of electrical signals;
- generating at least one image output based, at least in part, on the plurality of recorded signal vectors and the plurality of light patterns; and
- determining the presence of at least one transient effect on the device by using the at least one image output.

9. A method in accordance with claim 8, further comprising receiving the plurality of electrical signals via an electrical interface that is coupled to the device, prior to the plurality of electrical signals being received by the signal processing apparatus.

10. A method in accordance with claim 8, further comprising modifying the plurality of electrical signals, via an amplifier, prior to the plurality of electrical signals being received by the signal processing apparatus.

11. A method in accordance with claim 8, wherein digitizing each of the plurality of electrical signals comprises digitizing each of the plurality of electrical signals, via a converter.

12. A method in accordance with claim 8, wherein generating at least one image output comprises generating a plurality of image outputs based, at least in part, on a plurality of time steps of the plurality of recorded signal vectors and the plurality of light patterns such that each of the plurality of image outputs corresponds to a different time step of the plurality of time steps.

13. A method in accordance with claim 8, wherein generating at least one image output comprises generating at least one image output by executing a compressive sensing recovery algorithm.

14. A method in accordance with claim 8, wherein determining the presence of at least one transient effect on the device comprises determining the presence of at least one of a spatial or a temporal response of the device.

15. A system comprising:
- a device; and
- an image detection assembly coupled to said device, wherein said image detection assembly comprises:
  - a light source configured to generate at least one pulsed light beam;
  - a modulator that is positioned along a beam path from said light source, wherein said modulator is configured to direct the at least one pulsed light beam onto said device via a plurality of light patterns such that a plurality of electrical signals are generated by said device, wherein each of the plurality of electrical signals corresponds to a different light pattern of the plurality of light patterns; and
  - a signal processing apparatus coupled to said device, wherein said signal processing apparatus is configured to:
    - receive the plurality of electrical signals;
    - digitize each of the plurality of electrical signals to record a plurality of signal vectors such that each of the plurality of signal vectors corresponds to a different electrical signal of the plurality of electrical signals; and
    - generate at least one image output based, at least in part, on the plurality of recorded signal vectors and the plurality of light patterns such that the at least one image output enables a determination of at least one transient effect on said device.

16. A system in accordance with claim 15, wherein said image detection assembly further comprises an electrical interface coupled to said device, wherein said electrical interface is configured to receive the plurality of electrical signals prior to the plurality of electrical signals being received by said signal processing apparatus.

17. A system in accordance with claim 15, wherein said image detection assembly further comprises an amplifier coupled to said device, wherein said amplifier is configured to modify the plurality of electrical signals prior to the plurality of electrical signals being received by said signal processing apparatus.

18. A system in accordance with claim 15, wherein said signal processing apparatus comprises a converter coupled to the device, wherein said converter is configured to digitize each of the plurality of electrical signals.

19. A system in accordance with claim 15, wherein said signal processing apparatus is configured to generate a plurality of image outputs based, at least in part, on a plurality of time steps of the plurality of recorded signal vectors and the plurality of light patterns such that each of the plurality of image outputs corresponds to a different time step of the plurality of time steps.

20. A system in accordance with claim 15, wherein said signal processing apparatus is configured to generate the at least one image output by executing a compressive sensing recovery algorithm.

21. A system in accordance with claim 15, wherein said device comprises an integrated circuit.

22. A system in accordance with claim 21, wherein said signal processing apparatus is configured to generate the at least one image output such that the at least one image output enables a determination of at least one of a spatial or a temporal response of said integrated circuit.

\* \* \* \* \*